US008231732B2

(12) United States Patent
Nakagawa

(10) Patent No.: US 8,231,732 B2
(45) Date of Patent: Jul. 31, 2012

(54) CLEANING METHOD AND SUBSTRATE PROCESSING APPARATUS

(75) Inventor: Yusuke Nakagawa, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 663 days.

(21) Appl. No.: 12/388,921

(22) Filed: Feb. 19, 2009

(65) Prior Publication Data
US 2009/0205676 A1 Aug. 20, 2009

Related U.S. Application Data

(60) Provisional application No. 61/048,257, filed on Apr. 28, 2008.

(30) Foreign Application Priority Data

Feb. 20, 2008 (JP) ................................ 2008-039359

(51) Int. Cl.
*C25F 1/00* (2006.01)

(52) U.S. Cl. ................. 134/1; 134/1.1; 134/1.2; 134/21; 134/26; 134/34; 134/36; 134/42; 134/902; 438/902

(58) Field of Classification Search ............... 134/1, 1.1, 134/1.2, 21, 26, 34, 36, 42, 902; 438/905
See application file for complete search history.

(56) References Cited

U.S. PATENT DOCUMENTS

| 6,569,257 | B1 * | 5/2003 | Nguyen et al. ................... 134/26 |
| 7,481,230 | B2 * | 1/2009 | Sakima ........................... 134/1.1 |
| 7,767,584 | B1 * | 8/2010 | Singh et al. .................... 438/706 |
| 2004/0077511 | A1 * | 4/2004 | Barnes et al. .................. 510/175 |
| 2004/0182415 | A1 * | 9/2004 | Yoon et al. ..................... 134/1.2 |
| 2007/0186952 | A1 * | 8/2007 | Honda et al. ................... 134/1.1 |
| 2008/0173399 | A1 * | 7/2008 | Nakagawa ................. 156/345.1 |

FOREIGN PATENT DOCUMENTS

JP 11-145115 5/1999

* cited by examiner

*Primary Examiner* — Bibi Carrillo
(74) *Attorney, Agent, or Firm* — Oblon, Spivak, McClelland, Maier & Neustadt, L.L.P.

(57) ABSTRACT

A cleaning method that can prevent abnormal wear of an O-ring. A cleaning gas containing at least oxygen gas is supplied to the interior of a chamber in which a substrate is accommodated, and radio-frequency voltage is applied to the interior of the chamber to produce oxygen radicals from the cleaning gas. When the amount of deposit produced in the chamber in plasma processing is larger than a predetermined amount, the amount of fluorine radicals in the chamber is increased, and when the amount of the deposit is smaller than the predetermined amount, the amount of fluorine radicals in the chamber is decreased.

11 Claims, 7 Drawing Sheets

CLEANING METHOD AND SUBSTRATE PROCESSING APPARATUS

BACKGROUND OF THE INVENTION

1. Field of the Invention

The present invention relates to a cleaning method and a substrate processing apparatus, and in particular relates to a cleaning method for a substrate processing apparatus using plasma produced from a fluorocarbon-based process gas.

2. Description of the Related Art

A substrate processing apparatus that subjects a semiconductor wafer (hereinafter referred to merely as a "wafer") as a substrate to plasma processing has an accommodating chamber in which a wafer is accommodated. A process gas is supplied to the interior of the accommodating chamber, and the supplied process gas is excited to be turned into plasma. Here, if a fluorocarbon-based (CF-based) gas is used, CF type deposit and hydrocarbon type (CH type) deposit become attached to surfaces of component parts and inner wall surfaces of the accommodating chamber. While the next wafer is being subjected to the plasma processing, the attached deposit may come off and turn into particles, and the particles may become attached to the wafer. Moreover, the attached deposit may become dissociated again to affect the characteristics of the plasma processing, for example, the characteristics of etching.

Accordingly, dry cleaning has conventionally been carried out so as to remove the CF type deposit and the CH type deposit attached to surfaces of component parts and so on in the accommodating chamber. In the dry cleaning, oxygen gas is supplied to the interior of the accommodating chamber, and the oxygen gas is excited to produce plasma. Oxygen radicals (O radicals and $O_2$ radicals) in the plasma react with the CF type deposit and the CH type deposit and turn into carbon monoxide (CO) and carbon dioxide ($CO_2$). The carbon monoxide and carbon dioxide are discharged from the accommodating chamber. As a result, the CF type deposit and the CH type deposit are removed.

To facilitate the removal of the CF type deposit and the CH type deposit, there has been known that not only oxygen gas but also carbon tetrafluoride ($CF_4$) gas is supplied to the interior of the accommodating chamber (see, for example, Japanese Laid-Open Patent Publication (Kokai) No. H11-145115). The carbon tetrafluoride gas is excited to produce fluorine radicals. The fluorine radicals tend to bind with carbon atoms, and hence facilitate decomposition of the CF type deposit and the CH type deposit.

In the substrate processing apparatus, a sealing member, in particular, an O-ring has been widely used so as to seal the interior of the accommodating chamber from outside.

However, the O-ring is made of fluorine-based rubber (for example, FKM), and the composition thereof is similar to the composition of the CF type deposit and the CH type deposit. For this reason, if carbon tetrafluoride gas is used in the dry cleaning, the O-ring may abnormally wear due to fluorine radicals produced from the tetrafluoride gas.

Moreover, even if carbon tetrafluoride gas is not used in the dry cleaning, fluorine radicals are produced at the same time when the CF type deposit attached to surfaces of component parts in the accommodating chamber react with oxygen radicals to produce carbon monoxide and carbon dioxide, and hence the O-ring may abnormally wear after all.

SUMMARY OF THE INVENTION

The present invention provides a cleaning method and a substrate processing apparatus that can prevent abnormal wear of a sealing member.

Accordingly, in a first aspect of the present invention, there is provided a cleaning method for a substrate processing apparatus that has an accommodating chamber in which a substrate is accommodated, and a sealing member made of fluorine-based rubber that seals an interior of the accommodating chamber from outside, and that carries out plasma processing on the substrate using plasma produced from a fluorocarbon-based gas in the accommodating chamber, comprising a cleaning step of supplying a cleaning gas containing at least oxygen gas to the interior of the accommodating chamber and applying radio-frequency voltage to the interior of the accommodating chamber to produce oxygen radicals from the cleaning gas, wherein in the cleaning step, when an amount of deposit produced in the accommodating chamber during the plasma processing is larger than a predetermined amount, an amount of fluorine radicals in the accommodating chamber is increased, and when the amount of the deposit is smaller than the predetermined amount, the amount of fluorine radicals in the accommodating chamber is decreased.

According to the first aspect of the present invention, when the amount of deposit produced in the accommodating chamber during the plasma processing is larger than the predetermined amount, the amount of fluorine radicals in the accommodating chamber is increased when the oxygen radicals are produced from the cleaning gas, and when the amount of deposit is smaller than the predetermined amount, the amount of fluorine radicals in the accommodating chamber is decreased when the oxygen radicals are produced from the cleaning gas. If radio-frequency voltage is applied to the interior of the accommodating chamber when the amount of deposit in the accommodating chamber is larger than the predetermined amount, a large number of fluorine radicals are produced from the deposit, and at this time, by further increasing the amount of fluorine radicals in the accommodating chamber, an excessive amount of fluorine radicals can be made to exist in the accommodating chamber as compared with oxygen radicals. A fluorine radical deprives a carbon atom-to-hydrogen atom bond of a hydrogen atom in the sealing member made of fluorine-based rubber to produce a carbon atom having one dangling bond, but because an excessive amount of fluorine radicals exist, there is a high possibility that the carbon atom having one dangling bond bonds with the fluorine radical, not an oxygen radical. Then, a carbon atom-fluorine atom bond produced by bonding of the carbon atom having one dangling bond with the fluorine radical is stable because the fluorine radical is univalent. Therefore, in the sealing member, a polymer of carbon atoms in a bonded structure between monomers is not deprived of a bond by a carbon-atom-to-fluorine atom bond. On the other hand, when the amount of deposit is smaller than the predetermined amount, a large amount of fluorine radicals are not produced from the deposit even if radio-frequency voltage is applied to the interior of the accommodating chamber. At this time, by further decreasing the amount of fluorine radicals in the accommodating chamber, an excessive amount of oxygen radicals can be made to exist in the accommodating chamber as compared with fluorine radicals. As a result, the possibility that in the sealing member, a carbon atom-hydrogen atom bond is deprived of a hydrogen atom is decreased, and there is thus little possibility that a carbon atom having one dangling bond is produced, and a polymer of carbon atoms in a bonded structure between monomers is not deprived of a bond. For the reasons stated above, bonded structures between monomers in the sealing member can be prevented from collapsing, and the abnormal wear of the sealing member can be prevented.

The first aspect of the present invention can provide a cleaning method, wherein when the amount of the deposit is smaller than the predetermined amount, component parts of the accommodating chamber are heated in the plasma processing.

According to the first aspect of the present invention, when the amount of deposit is smaller than the predetermined amount, the component parts of the accommodating chamber are heated in the plasma processing. If the component parts are heated, the deposit in the accommodating chamber can be removed through vaporization, and thus the amount of deposit can be further decreased. As a result, the amount of fluorine radicals produced from the deposit can be decreased, and hence an excessive amount of oxygen radicals can be reliably made to exist in the accommodating chamber as compared with fluorine radicals.

The first aspect of the present invention can provide a cleaning method, wherein when the amount of the deposit is smaller than the predetermined amount, a value of the radio-frequency voltage applied to the interior of the accommodating chamber in the cleaning step is increased.

According to the first aspect of the present invention, when the amount of deposit is smaller than the predetermined amount, the value of the radio-frequency voltage applied to the interior of the accommodating chamber in the cleaning step is increased. If the value of the radio-frequency voltage is increased, production of oxygen radicals from the oxygen gas in the cleaning gas can be facilitated. As a result, an excessive amount of oxygen radicals can be reliably made to exist in the accommodating chamber as compared with fluorine radicals.

The first aspect of the present invention can provide a cleaning method, wherein when the amount of the deposit is smaller than the predetermined amount, an amount of the oxygen gas contained in the cleaning gas is increased.

According to the first aspect of the present invention, when the amount of deposit is smaller than the predetermined amount, the amount of oxygen gas contained in the cleaning gas is increased. This can increase the amount of oxygen radicals produced from the cleaning gas, and hence an excessive amount of oxygen radicals can be reliably made to exist in the accommodating chamber as compared with fluorine radicals.

The first aspect of the present invention can provide a cleaning method, wherein when the amount of the deposit is smaller than the predetermined amount, a hydrogen-containing gas is mixed in the cleaning gas.

According to the first aspect of the present invention, when the amount of deposit is smaller than the predetermined amount, a hydrogen-containing gas is mixed in the cleaning gas. Hydrogen radicals are produced from the hydrogen-containing gas, and the hydrogen radicals bind with fluorine radicals, and hence the amount of fluorine radicals decreases. As a result, an excessive amount of oxygen radicals can be reliably made to exist in the accommodating chamber as compared with fluorine radicals.

The first aspect of the present invention can provide a cleaning method, wherein the hydrogen-containing gas comprises methane gas.

According to the first aspect of the present invention, the hydrogen-containing gas is comprised of methane gas. Because the methane gas is stable, the safety of the cleaning method can be enhanced.

The first aspect of the present invention can provide a cleaning method, wherein when the amount of the deposit is larger than the predetermined amount, component parts of the accommodating chamber are cooled in the plasma processing.

According to the first aspect of the present invention, when the amount of deposit is larger than the predetermined amount, the component parts of the accommodating chamber are cooled in the plasma processing. If the component parts are cooled, vaporization of the deposit in the accommodating chamber is suppressed, and thus the amount of deposit increases. As a result, the amount of fluorine radicals produced from the deposit can be increased, and hence an excessive amount of fluorine radicals can be made to exist in the accommodating chamber as compared with oxygen radicals.

The first aspect of the present invention can provide a cleaning method, wherein when the amount of the deposit is larger than the predetermined amount, an amount of the oxygen gas contained in the cleaning gas is decreased.

According to the first aspect of the present invention, when the amount of deposit is larger than the predetermined amount, the amount of oxygen gas contained in the cleaning gas is decreased. This can decrease the amount of oxygen radicals produced from the cleaning gas, and hence an excessive amount of fluorine radicals can be made to exist in the accommodating chamber as compared with oxygen radicals.

The first aspect of the present invention can provide a cleaning method, wherein when the amount of the deposit is larger than the predetermined amount, a fluorocarbon-based gas is mixed in the cleaning gas.

According to the first aspect of the present invention, when the amount of deposit is larger than the predetermined amount, a fluorocarbon-based gas is mixed in the cleaning gas. Thus, fluorine radicals can be produced from the cleaning gas, and hence an excessive amount of fluorine radicals can be made to exist in the accommodating chamber as compared with oxygen radicals.

The first aspect of the present invention can provide a cleaning method, wherein when the amount of the deposit is larger than the predetermined amount, a flow rate of the fluorocarbon-based gas in the plasma processing is increased.

According to the first aspect of the present invention, when the amount of deposit is larger than the predetermined amount, the flow rate of the fluorocarbon-based gas in the plasma processing is increased. This can increase the amount of deposit in the accommodating chamber, and hence the amount of fluorine radicals produced from the deposit increases. As a result, an excessive amount of fluorine radicals can be made to exist in the accommodating chamber as compared with oxygen radicals.

Accordingly, in a second aspect of the present invention, there is provided a substrate processing apparatus that has an accommodating chamber in which a substrate is accommodated, and a sealing member made of fluorine-based rubber that seals an interior of the accommodating chamber from outside, and that carries out plasma processing on the substrate using plasma produced from a fluorocarbon-based gas in the accommodating chamber, wherein in a case that a cleaning gas containing at least oxygen gas is supplied to the interior of the accommodating chamber, and radio-frequency voltage is applied to the interior of the accommodating chamber to produce oxygen radicals from the cleaning gas, when an amount of deposit produced in the accommodating chamber in the plasma processing is larger than a predetermined amount, an amount of fluorine radicals in the accommodating chamber is increased, and when the amount of the deposit is smaller than the predetermined amount, the amount of the fluorine radicals in the accommodating chamber is decreased.

The features and advantages of the invention will become more apparent from the following detailed description taken in conjunction with the accompanying drawings.

DETAILED DESCRIPTION OF PREFERRED EMBODIMENTS

The present invention will now be described in detail with reference to the drawings showing a preferred embodiment thereof.

First, a description will be given of a substrate processing apparatus according to an embodiment of the present invention.

Figure 1:
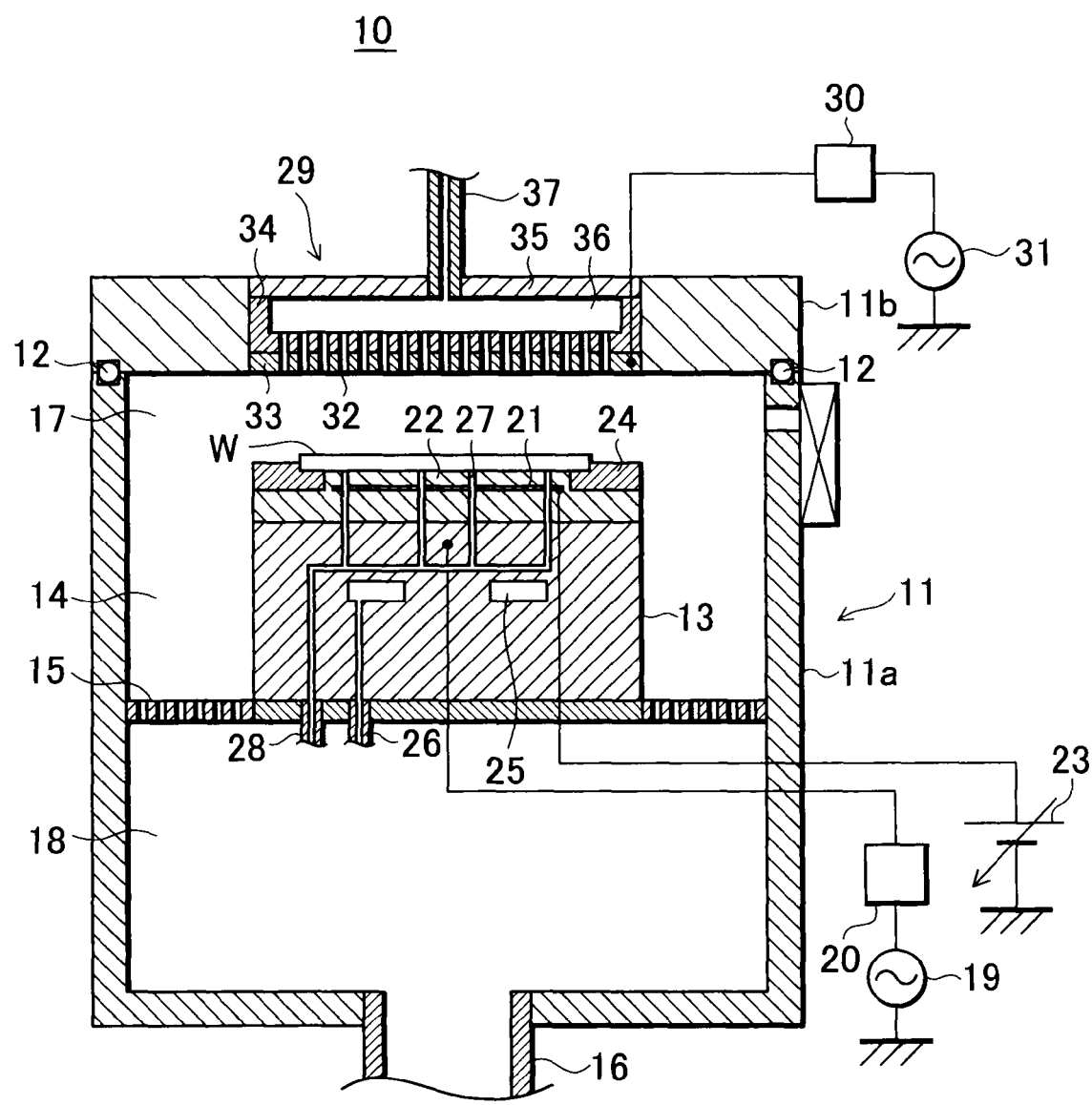
FIG. 1 is a cross-sectional view schematically showing the construction of a substrate processing apparatus according to an embodiment of the present invention.

FIG. 1 is a cross-sectional view schematically showing the construction of the substrate processing apparatus according to the present embodiment. This substrate processing apparatus is constructed such as to carry out plasma etching on a semiconductor wafer as a substrate.

Referring to FIG. 1, the substrate processing apparatus 10 has a chamber 11 in which a semiconductor wafer (hereinafter referred to merely as a "wafer") W having a diameter of, for example, 300 mm is accommodated, and that is made of aluminum. The chamber 11 has a cylindrical side wall 11a and a disk-shaped upper lid 11b, and an O-ring 12 (sealing member) is disposed between the side wall 11a and the upper lid 11b. The O-ring 12, which is made of fluorine-based rubber, for example, FKM (vinylidene fluoride rubber), is accommodated in O-ring trenches pierced in respective surface of the side wall 11a and the upper lid 11b, and comes into abutment with respective bottom faces of the O-ring trenches to seal the interior of the chamber 11 from outside (atmosphere).

Moreover, a cylindrical susceptor 13 is disposed in the substrate processing chamber 11 as a stage on which the wafer W is mounted, and a side exhaust path 14 that acts as a flow path through which gas above the susceptor 13 is exhausted out of the chamber 11 is formed between an inner side wall of the chamber 11 and the side face of the susceptor 13. An exhaust plate 15 is disposed part way along the side exhaust path 14.

The exhaust plate 15 is a plate-shaped member having a large number of holes therein and acts as a partition plate that partitions the chamber 11 into an upper portion and a lower portion. In the upper portion (hereinafter referred to as the "reaction chamber") 17 of the chamber 11 partitioned by the exhaust plate 15, plasma is produced. An exhaust pipe 16 through which gas in the chamber 11 is exhausted is connected to the lower portion (hereinafter referred to as the "exhaust chamber (manifold)") 18 of the chamber 11. The exhaust plate 15 captures or reflects plasma produced in the reaction chamber 17 to prevent leakage of the plasma into the manifold 18.

The exhaust pipe 16 has a TMP (turbo-molecular pump) and a DP (dry pump) (both not shown) connected thereto, and these pumps reduce the pressure in the chamber 11 down to a vacuum state. Specifically, the DP reduces the pressure in the chamber 11 from atmospheric pressure down to an intermediate vacuum state (e.g. a pressure of not more than $1.3 \times 10$ Pa (0.1 Torr)), and the TMP is operated in collaboration with the DP to reduce the pressure in the chamber 11 down to a high vacuum state (e.g. a pressure of not more than $1.3 \times 10^{-3}$ Pa ($1.0$ ($10^{-5}$ Torr)), which is at a lower pressure than the intermediate vacuum state. An APC valve (not shown) controls the pressure in the chamber 11.

A lower radio frequency power source 19 is connected to the susceptor 13 in the chamber 11 via a lower matcher 20. The lower radio frequency power source 19 supplies predetermined radio frequency electrical power to the susceptor 13. The susceptor 13 thus acts as a lower electrode. Moreover, the lower matcher 20 reduces reflection of the radio frequency electrical power from the susceptor 13 so as to maximize the efficiency of the supply of the radio frequency electrical power into the susceptor 13.

An electrostatic chuck 22 having an electrostatic electrode plate 21 therein is provided in an upper portion of the susceptor 13. The electrostatic chuck 22 is formed by placing an upper disk-shaped member, which has a smaller diameter than a lower disk-shaped member having a certain diameter, over the lower disk-shaped member. It should be noted that the electrostatic chuck 22 is made of a ceramic. When the wafer W is placed on the susceptor 13, the wafer W is disposed on the upper disk-shaped member of the electrostatic chuck 22.

Moreover, a DC power source 23 is electrically connected to the electrostatic chuck 22. Upon a positive DC voltage being applied to the electrostatic electrode plate 21, a negative potential is produced on a surface of the wafer W which faces the electrostatic chuck 22 (hereinafter referred to as "the rear surface of the wafer W"). A potential difference thus arises between the electrostatic electrode plate 21 and the rear surface of the wafer W, and hence the wafer W is attracted to and held on the upper disk-shaped member of the electrostatic chuck 22 through a Coulomb force or a Johnsen-Rahbek force due to the potential difference.

Moreover, an annular focus ring 24 is mounted on the electrostatic chuck 22 such as to surround the attracted and held wafer W. The focus ring 24 is made of a conductive member such as silicon, and focuses the plasma in the reaction chamber 17 toward a front surface of the wafer W, thus improving the efficiency of the plasma etching.

An annular coolant chamber 25 that extends, for example, in a circumferential direction of the susceptor 13 is provided inside the susceptor 13. A coolant, for example, cooling water or a Galden (registered trademark) fluid, at a low temperature is circulated through the coolant chamber 25 via coolant piping 26 from a chiller unit (not shown). The susceptor 13 cooled by the low-temperature coolant cools the wafer W and the focus ring 24 via the electrostatic chuck 22.

A plurality of heat transfer gas supply holes 27 are opened to a portion of the upper surface of the upper disk-shaped member of the electrostatic chuck 22 on which the wafer W is attracted and held (hereinafter referred to as the "attracting surface"). The heat transfer gas supply holes 27 are connected to a heat-transmitting gas supply unit (not shown) via a heat-transmitting gas supply line 28, and supply helium (He) gas as a heat transfer gas into a gap between the attracting surface and the rear surface of the wafer W. The helium gas supplied into the gap between the attracting surface and the rear surface of the wafer W effectively transfers heat from the wafer W to the electrostatic chuck 22.

A showerhead 29 is disposed in a ceiling portion of the chamber 11 such as to face the susceptor 13. An upper radio-frequency power source 31 is connected to the showerhead 29 via an upper matcher 30 and supplies predetermined radio-frequency electrical power to the showerhead 29. The showerhead 29 thus acts as an upper electrode. It should be noted that the upper matcher 30 has a similar function to the lower matcher 20 described above.

The showerhead 29 has a ceiling electrode plate 33 having therein a number of gas holes 32, a cooling plate 34 that detachably suspends the ceiling electrode plate 33, and a lid member 35 that covers the cooling plate 34. Moreover, a buffer chamber 36 is provided inside the showerhead 29, and a process gas-introducing pipe 37 is connected to the buffer chamber 36. The showerhead 29 supplies a CF-based gas, for example, a process gas including carbon tetrafluoride gas supplied to the buffer chamber 36 through the process gas-introducing pipe 37 to the reaction chamber 17 via the gas holes 32.

Further, the substrate processing apparatus 10 has a temperature control device (not shown) that controls the temperatures of component parts and inner wall surfaces of the reaction chamber 17. Examples of the temperature control device include a heater or a Peltier element embedded in a component part or the like, or a radiation lamp or the like disposed in the reaction chamber 17. It should be noted that in the substrate processing apparatus 10, the above-mentioned temperature control device can heat and cool component parts and so on.

In the substrate processing apparatus 10, radio-frequency electrical power is supplied to the susceptor 13 and the showerhead 29 to apply radio-frequency voltage to the interior of the reaction chamber 17 so that the process gas supplied from the showerhead 29 is turned into plasma (positive ions and radicals), whereby the wafer W is subjected to the plasma etching using the plasma.

Moreover, in the substrate processing apparatus 10, CF type deposit or CH type deposit is produced when the wafer W is subjected to the plasma etching using plasma produced from CF type gas, and hence on a regular basis, for example, on a lot-by-lot basis, or when the amount of CF type deposit or the like attached to component parts and so on exceeds a certain threshold value, dry cleaning is carried out. In the dry cleaning, the showerhead 29 supplies a cleaning gas containing oxygen gas to the interior of the reaction chamber 17, and further, the showerhead 29 or the like applies radio-frequency voltage to the interior of the reaction chamber 17, so that oxygen plasma is produced from the cleaning gas. The oxygen plasma then removes the CF type deposit and so on by converting the same into carbon monoxide and so on.

Operation of the component elements of the above described substrate processing apparatus 10 is controlled in accordance with a program for the plasma etching by a CPU of a control unit (not shown) of the substrate processing apparatus 10.

In the above described dry cleaning, when the oxygen plasma converts the CF type deposit and so on into carbon monoxide and so on, fluorine radicals are produced from the CF type deposit. If the fluorine radicals contact the O-ring 12, the O-ring 12 may abnormally wear. The abnormal wear of the O-ring 12 will now be concretely described with reference to FIGS. 2A to 2D.

Figure 2A:
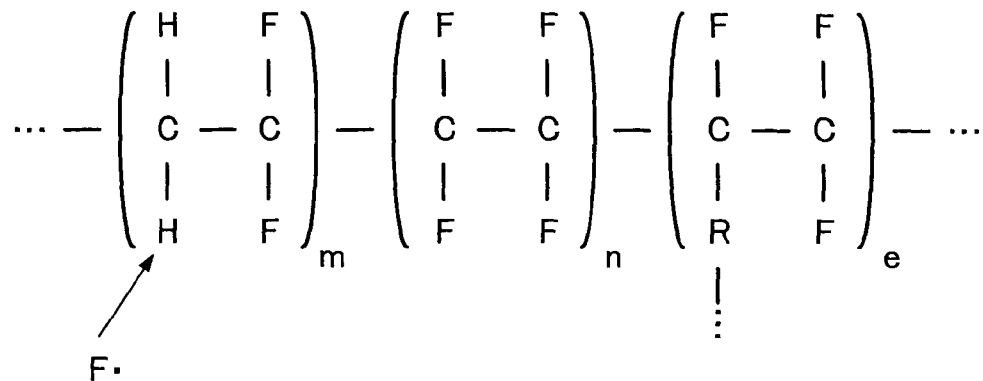
FIGS. 2A, 2B, 2C, and 2D are diagrams useful in explaining the mechanism of abnormal wear of an O-ring made of FKM.

The FKM constituting the O-ring 12 is comprised of polymers each of which is formed through polymerizing three kinds of monomers as shown in FIG. 2A (in the figure, "C", "H", "F", and "R" designate a carbon atom, a hydrogen atom, a fluorine atom, and a hydrocarbon radical, respectively, and "m", "n", and "e" are natural numbers).

If a fluorine radical (designated by "F•" in the figure) is produced during the dry cleaning, the fluorine radical deprives a carbon atom-to-hydrogen atom bond in a monomer of a hydrogen atom.

Figure 2B:
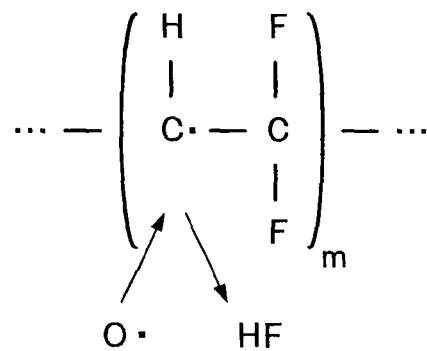

At this time, as shown in FIG. 2B, the fluorine radical turns into a hydrogen fluoride, and also, a carbon atom having one dangling bond (a carbon atom in a dangling bonded state) is produced in the monomer, but an oxygen radical (designated by "O•" in the figure) in the oxygen plasma produced from the cleaning gas bonds with the above-mentioned carbon atom having one dangling bond and becomes a constituent atom of the monomer.

Figure 2C:
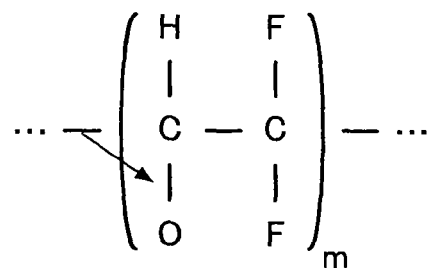

However, the oxygen radical has two dangling bonds, and hence one dangling bond remains even if the oxygen radical bonds with the carbon atom mentioned above. Thus, the carbon atom-to-oxygen atom bond in the monomer deprives a nearby bonded structure of a bond, as shown in FIG. 2C. Here, because a bonded structure between monomers is formed by polymerization, a bonded structure between monomers tends to be deprived of a bond.

Figure 2D:
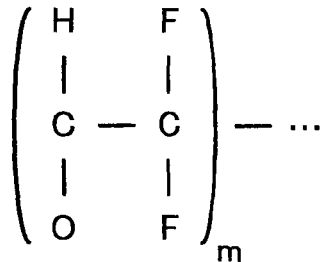

As shown in FIG. 2D, the carbon atom-to-oxygen atom bond in the monomer which has deprived the bond is stable, but the bonded structure which has been deprived of the bond collapses, and the polymerization of the monomers is eliminated. Then, insofar as a certain amount of fluorine radicals exist, chain-reaction elimination of monomers occurs. Thus, polymers disappear in the end, and the O-ring 12 comprised of the polymers abnormally wears.

Before developing the present invention, in the situation where the CF type deposit or the like was not attached to the component parts or the like in the substrate processing apparatus 10, the inventors of the present invention supplied a cleaning gas containing oxygen gas into the reaction chamber 17, applied radio-frequency electrical power into the reaction chamber 17, and measured the wear amount of the O-ring 12 in the case that the oxygen plasma was produced from the cleaning gas. At this time, to produce fluorine radicals in the reaction chamber 17, the inventors added carbon tetrafluoride gas to the cleaning gas. Also, to investigate the effect of the amount of the fluorine radicals on the wear amount of the O-ring 12, the inventors varied the flow rate of carbon tetrafluoride gas added to the cleaning gas. Then, the inventors graphed the measured wear amount of the O-ring 12 in FIG. 3.

Figure 3:
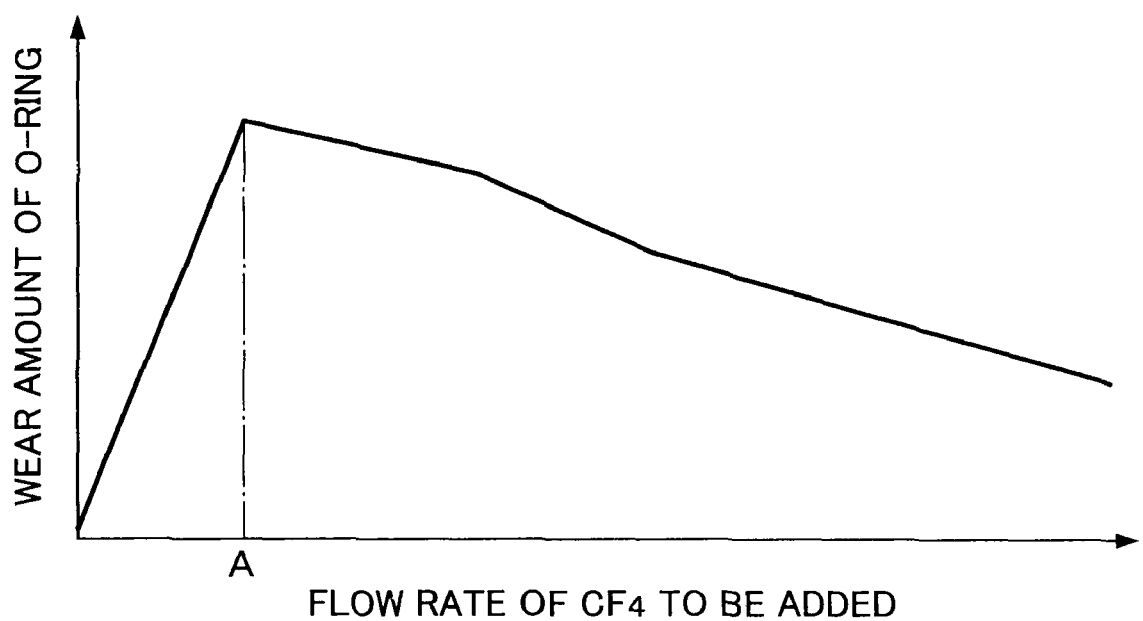
FIG. 3 is a graph showing the relationship between the flow rate of added carbon tetrafluoride gas to be added and the wear amount of the O-ring.

In the graph of FIG. 3, the abscissa indicates the wear amount of the O-ring 12, and the ordinate indicates the flow rate of carbon tetrafluoride gas to be added. As shown in the graph of FIG. 3, as the flow rate of carbon tetrafluoride gas to be added is increased from zero, the wear amount of the O-ring 12 increases in the beginning, but when the flow rate of carbon tetrafluoride gas to be added exceeds a certain flow rate ("A" in the figure), the wear amount of the O-ring 12 decreases. That is, it was ascertained that when the flow rate of carbon tetrafluoride gas to be added is higher than the certain flow rate, as the flow rate of the carbon tetrafluoride gas to be added is increased (the amount of fluorine radicals is increased), the wear amount of the O-ring 12 decreases, and when the flow rate of carbon tetrafluoride gas to be added is lower than the certain flow rate, as the flow rate of carbon tetrafluoride gas to be added is decreased (the amount of fluorine radicals is decreased), the wear amount of the O-ring 12 decreases.

Here, in the above described measurement, because the carbon tetrafluoride gas is added so as to produce fluorine radicals, the carbon tetrafluoride gas corresponds to CF type deposit. It was thus found that when the amount of CF type deposit attached to the component parts and so on is larger than a certain amount (predetermined amount), as the amount of fluorine radicals in the reaction chamber 17 is increased, the wear amount of the O-ring 12 decreases, and when the amount of CF type deposit is smaller than the certain amount (predetermined amount), as the amount of fluorine radicals in the reaction chamber 17 is decreased, the wear amount of the O-ring 12 decreases.

Regarding the mechanism of the reduction in the wear amount of the O-ring, the present inventors have come up with the hypothesis described below by referring to the mechanism of the abnormal wear of the O-ring 12 described above.

(When the Amount of CF Type Deposit Attached to the Component Parts and so on is Larger than the Certain Amount)

When the amount of CF type deposit attached to the component parts and so on is larger than the certain amount, the amount of fluorine radicals existing in the reaction chamber 17 in the dry cleaning increases. At this time, if the amount of fluorine radicals existing in the reaction chamber 17 is further increased, an excessive amount of fluorine radicals exist in the reaction chamber 17 as compared with oxygen radicals.

Figure 4A:
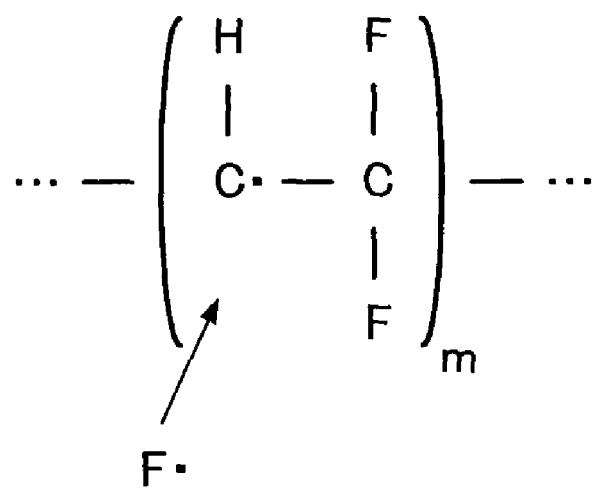
FIGS. 4A and 4B are diagrams useful in explaining a mechanism to prevent abnormal wear of the O-ring made of FKM.
Figure 4B:
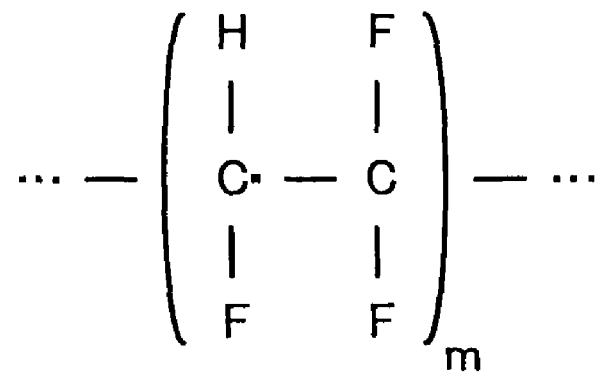

As a result, in the FKM constituting the O-ring 12, first, when a fluorine radical deprives a carbon atom-to-hydrogen atom bond in a monomer of a hydrogen atom (FIG. 2A), and a carbon atom having one dangling bond is produced in the monomer (FIG. 2B), there is a high possibility that the carbon atom bonds with another fluorine radical, not an oxygen radical (FIG. 4A). Here, because the fluorine radical has only one dangling bond, if the fluorine radical bonds with the carbon atom, no dangling bond remains in a carbon atom-to-fluorine atom bond. Therefore, the carbon atom-to-fluorine atom bond in the monomer becomes stable and never deprives a nearby bonded structure of a bond (FIG. 4B). Thus, the polymerization of monomers is not eliminated, polymers can be prevented from disappearing, and the O-ring 12 comprised of the polymers does not abnormally wear.

(When the Amount of CF Type Deposit Attached to the Component Parts and so on is Smaller than the Certain Amount)

When the amount of CF type deposit attached to the component parts and so on is smaller than the certain amount, the amount of fluorine radicals existing in the reaction chamber 17 in the dry cleaning decreases, and in comparison, the amount of oxygen radicals increases. At this time, if the amount of fluorine radicals in the reaction chamber 17 is further decreased, an excessive amount of oxygen radicals exist in the reaction chamber 17 as compared with fluorine radicals.

As a result, in the FKM constituting the O-ring 12, the possibility that a fluorine radical comes close to a carbon atom-to-hydrogen atom bond in a monomer decreases, and hence the possibility that a fluorine radical deprives a carbon atom-to-hydrogen atom bond in a monomer of a hydrogen atom decreases. Therefore, a carbon atom having one dangling bond is hardly produced in a monomer, and the monomer remains stable. Thus, a polymerization of carbon atoms in a bonded structure between monomers is not deprived of a bond. For this reason, the polymerization of monomers is not eliminated, polymers can be prevented from disappearing, and the O-ring 12 comprised of the polymers does not abnormally wear.

The present invention has been developed based on the above findings, and in the present embodiment, the amount of fluorine radicals and oxygen radicals in the dry cleaning is adjusted based on the amount of CF type deposit attached to the component parts and so on in the reaction chamber 17 when the wafer W is subjected to the plasma etching in the substrate processing apparatus 10. This prevents the abnormal wear of the O-ring 12.

Next, a description will be given of a cleaning method according to the present embodiment.

Figure 5:
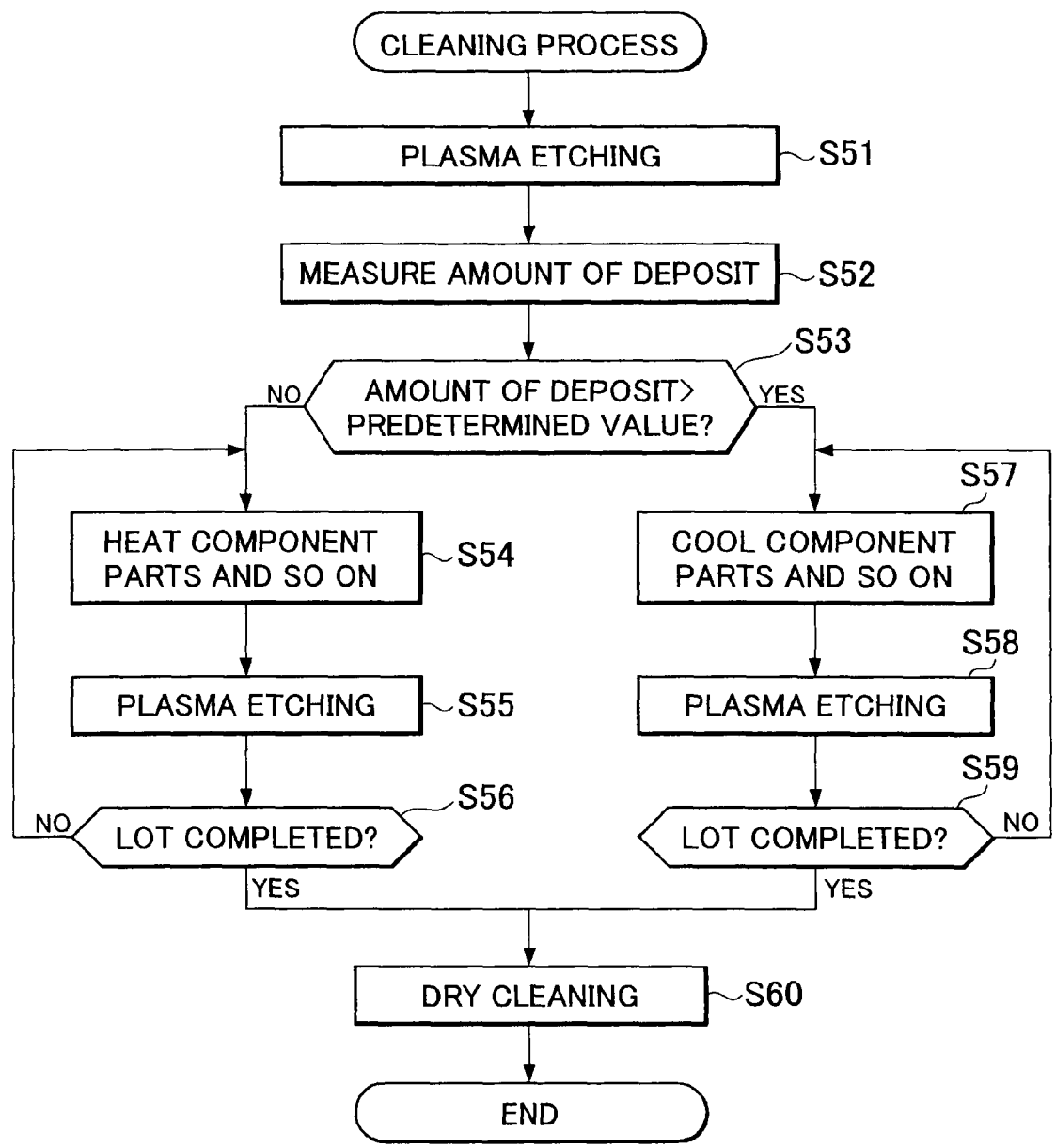
FIG. 5 is a flow chart of a substrate processing apparatus cleaning process as a cleaning method according to the present embodiment.

FIG. 5 is a flow chart showing a substrate processing apparatus cleaning process as the cleaning method according to the present embodiment.

Referring to FIG. 5, first, prior to the plasma etching of one lot, one wafer W (or a predetermined number of wafers W) is subjected to the first plasma etching in the substrate processing apparatus 10 (step S51), and the amount of CF type deposit attached to the component parts and so on in the reaction chamber 17 after the plasma etching is measured (step S52).

Examples of a method of measuring the amount of CF-type deposit include a method in which when a wafer W is to be subjected to the first plasma etching, a test piece made of a material that does not wear due to plasma is disposed in the reaction chamber 17, the test piece is taken out after the first plasma etching, and the amount of CF-type deposit attached to the test piece is actually measured, and a method in which when a wafer W is to be subjected to the first plasma etching, a test piece is disposed in the manifold 18, the amount of CF-type deposit attached to the test piece after the first plasma etching is actually measured, and the amount of CF-type deposit attached to the component parts and so on in the reaction chamber 17 is estimated from the actually measurement value.

Then, in a step S53, it is determined whether or not the measured amount of CF-type deposit is larger than a specified value (predetermined value), and if the amount of CF-type deposit is smaller than the specified value (NO to the step S53), the component parts and so on in the reaction chamber 17 are heated (step S54), and one wafer W is subjected to the plasma etching in the substrate processing apparatus 10 (step S55). In the step S55, the CF type deposit produced and attached to the component parts and so on during the plasma etching are vaporized and removed because the temperatures of the component parts and so on in the reaction chamber 17 have been increased due to the heating in the step S54.

Then, in a step S56, it is determined whether or not the plasma etching has been carried out on the wafers W of one lot, and if the plasma etching on the wafers W of one lot has been completed, the process proceeds to a step S60, and if the plasma etching on the wafers W of one lot has not yet been completed, the process returns to the step S54.

That is, in the case that a large amount of CF type deposit is not produced (NO to the step S53) in the first plasma etching (step S51), the CF type deposit is positively removed in the plasma etching on one lot, and hence the amount of CF-type deposit attached to the component parts and so on in the reaction chamber 17 after the plasma etching on one lot is excessively small.

It should be noted that the specified value in the step S53 is the amount of deposit corresponding to "A" in the graph of FIG. 3, and if the amount of CF-type deposit attached to the component parts and so on is larger than the specified value, as the amount of fluorine radicals in the reaction chamber 17 is increased in the dry cleaning, the wear amount of the O-ring 12 decreases, and if the amount of CF-type deposit attached to the component parts and so on is smaller than the specified value, as the amount of fluorine radicals in the reaction chamber 17 is decreased in the dry cleaning, the wear amount of the O-ring 12 decreases.

If, as a result of the determination in the step S53, the amount of CF-type deposit is larger than the specified value (YES to the step S53), the component parts and so on in the reaction chamber 17 are cooled (step S57), and one wafer W is subjected to the plasma etching in the substrate processing apparatus 10 (step S58). In the step S58, because the temperatures of the component parts and so on in the reaction chamber 17 have been decreased due to the cooling in the step S57, the vaporization of the CF type deposit produced and attached to the component parts and so on during the plasma etching is suppressed, and the amount of CF type deposit attached to the component parts and so on increases.

Then, in a step S59, it is determined whether or not the plasma etching has been carried out on the wafers W of one lot, and if the plasma etching on the wafers W of one lot has been completed, the process proceeds to the step S60, and if the plasma etching on the wafers W of one lot has not yet been completed, the process returns to the step S57.

That is, in the case that a large amount of CF type deposit is produced (YES to the step S53) in the first plasma etching (step S51), the vaporization of the CF type deposit is positively suppressed in the plasma etching on one lot, and hence the amount of CF type deposit attached to the component parts and so on in the reaction chamber 17 after the plasma etching on one lot is excessively large.

Then, a cleaning gas containing oxygen gas is supplied to the interior of the reaction chamber 17, and radio-frequency electrical power is applied to the interior of the reaction chamber 17, so that the cleaning gas is turned into oxygen plasma to perform the dry cleaning (step S60). In the step S60, the amount of CF type deposit attached to the component parts and so on in the reaction chamber 17 is excessively large or excessively small.

If the amount of CF type deposit attached to the component parts and so on in the reaction chamber 17 is excessively large, an excessive amount of fluorine radicals exists in the reaction chamber 17 as compared with oxygen radicals, and hence the O-ring 12 does not abnormally wear as described above. On the other hand, if the amount of CF type deposit attached to the component parts and so on in the reaction chamber 17 is excessively small, an excessive amount of oxygen radicals exists in the reaction chamber 17 as compared with fluorine radicals, and hence the O-ring 12 does not abnormally wear as described above. That is, the O-ring 12 does not abnormally wear in the dry cleaning in the step S60.

After that, the dry cleaning in the step S60 is carried out for a predetermined time period, followed by terminating the present process.

According to the process in FIG. 5, if the amount of CF type deposit attached to the component parts and so on in the first the plasma etching is larger than the specified value, the component parts and so on are cooled in the plasma etching on one lot to increase the amount of CF type deposit attached to the component parts and so on, so that in the subsequent dry cleaning, the amount of CF type deposit attached to the component parts and so on in the reaction chamber 17 is made to be excessively large. Thus, in the dry cleaning, an excessive amount of fluorine radicals exists in the reaction chamber 17 as compared with oxygen radicals, and hence the abnormal wear of the O-ring 12 can be prevented. On the other hand, if the amount of CF type deposit attached to the component parts and so on in the first the plasma etching is smaller than the specified value, the component parts and so on are heated in the plasma etching on one lot to remove the CF type deposit attached to the component parts and so on, so that in the subsequent dry cleaning, the amount of CF type deposit attached to the component parts and so on in the reaction chamber 17 is made to be excessively small. Thus, in the dry cleaning, an excessive amount of oxygen radicals exists in the reaction chamber 17 as compared with fluorine radicals, and hence the abnormal wear of the O-ring 12 can be prevented.

A method of causing an excessive amount of fluorine radicals to exist in the reaction chamber 17 as compared with oxygen radicals when the amount of CF type deposit attached to the component parts and so on in the first the plasma etching is larger than the specified value is not limited to the method in which the component parts and so on in the plasma etching on one lot are cooled. For example, the amount of oxygen gas included in the cleaning gas in the dry cleaning may be reduced so that the amount of oxygen radicals produced from the cleaning gas can be reduced, whereby an excessive amount of fluorine radicals can exist in the reaction chamber 17 as compared with oxygen radicals.

Alternatively, a CF type gas may be mixed in the cleaning gas so that fluorine radicals can be produced from the cleaning gas, whereby an excessive amount of fluorine radicals can exist in the reaction chamber 17 as compared with oxygen radicals.

Still alternatively, the flow rate of the CF type gas in the process gas in the plasma etching on one lot may be increased, so that in the subsequent dry cleaning, the amount of CF type deposit attached to the component parts and so on increases, and the amount of fluorine radicals increases. As a result, an excessive amount of fluorine radicals can be made to exist in the reaction chamber 17 as compared with oxygen radicals.

A method of causing an excessive amount of oxygen radicals to exist in the reaction chamber 17 as compared with fluorine radicals when the amount of CF type deposit attached to the component parts and so on in the first the plasma etching is smaller than the specified value is not limited to the method in which the component parts and so on in the plasma etching on one lot are heated. For example, in the dry cleaning, the value of radio-frequency voltage applied to the interior of the reaction chamber 17 may be increased. If the value of radio-frequency voltage applied to the interior of the reaction chamber 17 is increased, production of oxygen radicals from the oxygen gas in the cleaning gas can be facilitated. As a result, an excessive amount of oxygen radicals can be reliably made to exist in the reaction chamber 17 as compared with fluorine radicals.

Alternatively, the amount of oxygen gas included in the cleaning gas may be increased, so that the amount of oxygen radicals produced from the cleaning gas can be increased, and hence an excessive amount of oxygen radicals can be reliably made to exist in the accommodating chamber as compared with fluorine radicals.

Still alternatively, a hydrogen-containing gas, for example, methane gas may be mixed in the cleaning gas. Hydrogen radicals are produced from the methane gas and bind with fluorine radicals, so that the number of fluorine radicals decreases. As a result, an excessive amount of oxygen radicals can be reliably made to exist in the accommodating chamber as compared with fluorine radicals. Moreover, because the methane gas is stable, the safety of the cleaning method can be enhanced.

Although in the above described present embodiment, the O-ring 12 is comprised of the FKM, the O-ring 12 may be comprised of FFKM (tetrafluoroethylene-perfluorovinyl ether rubber).

Figure 6A:
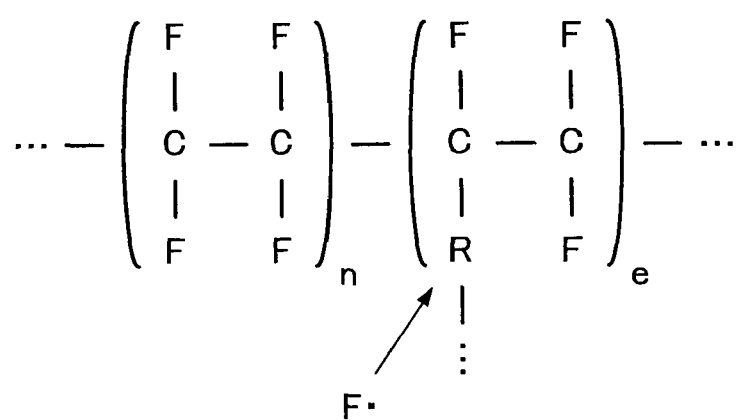
FIGS. 6A, 6B, 6C, and 6D are diagrams useful in explaining a mechanism of loss of a sealing function of an O-ring made of FFKM.

The FFKM is comprised of polymers formed by polymerization of two kinds of monomers as shown in FIG. 6A (in the figure, "C", "F", and "R" designate a carbon atom, a fluorine atom, a hydrocarbon radical, respectively, and "n" and "e" are natural numbers). A portion including "R" is a portion that is cross-linked to another polymer.

If a fluorine radical (designated by "F•" in the figure) is produced during the dry cleaning, the fluorine radical deprives a carbon atom-to-hydrogen atom bond in the cross-linked portion of a hydrogen atom.

Figure 6B:
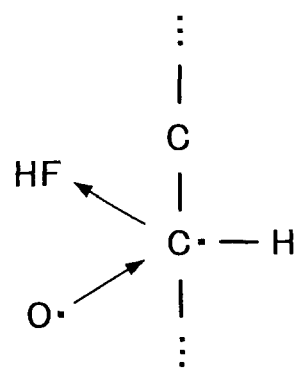

At this time, as shown in FIG. 6B, the fluorine radical turns into a hydrogen fluoride, and a carbon atom having one dangling bond (a carbon atom in a dangling bonded state) is produced in the cross-linked portion, but an oxygen radical (designated by "O•" in the figure) in the oxygen plasma produced from the cleaning gas bonds with the above-mentioned carbon atom having one dangling bond and becomes a constituent atom of the cross-linked portion.

Figure 6C:
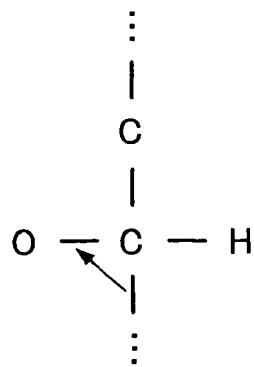

However, the oxygen radical has two dangling bonds, and hence one dangling bond remains even if the oxygen radical bonds with the carbon atom mentioned above. Thus, the carbon atom-to-oxygen atom bond in the cross-linked portion deprives another bonded structure, which exists in the same cross-linked portion, of a bond (FIG. 6C).

Figure 6D:
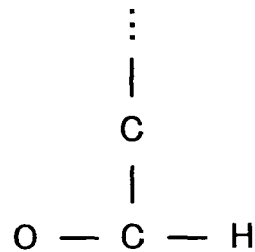

At this time, as shown in FIG. 6D, the carbon atom-to-oxygen atom bond in the monomer which has deprived the bond is stable, but the bonded structure which has been deprived of the bond collapses, and as a result, the cross-link with the other polymer is eliminated. Then, insofar as a certain amount of fluorine radicals exist, chain-reaction elimination of the cross-link occurs. Because the cross-linked portions insure the elasticity of the O-ring 12, the elasticity of the O-ring 12 is lost due to the elimination of the cross-link, resulting from occurrence of cracks, and thus the O-ring 12 cannot maintain its sealing function.

To cope with this, as is the case with the above described present embodiment, based on the amount of CF type deposit attached to the component parts and so on in the reaction chamber 17 when the wafer W is subjected to the first plasma etching, the amount of fluorine radicals and oxygen radicals in the dry cleaning is adjusted to prevent the elimination of cross-link in the O-ring 12, whereby the O-ring can maintain its sealing function.

Specifically, when the amount of CF-type deposit attached to the component parts and so on when the wafer W is subjected to the first plasma etching is larger than a specified value, the component parts and so on are cooled in the plasma etching on one lot so as to cause an excessive amount of fluorine radicals to exist in the reaction chamber 17 as compared with oxygen radicals in the dry cleaning.

Figure 7A:
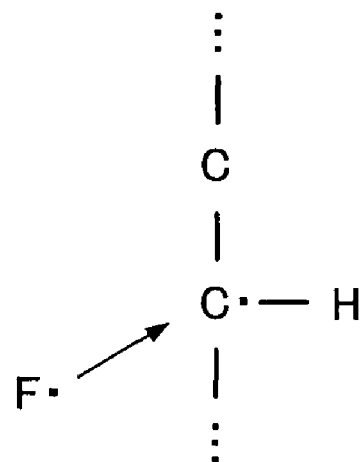
FIGS. 7A and 7B are diagrams useful in explaining a mechanism to maintain the sealing function of the O-ring made of FFKM.
Figure 7B:
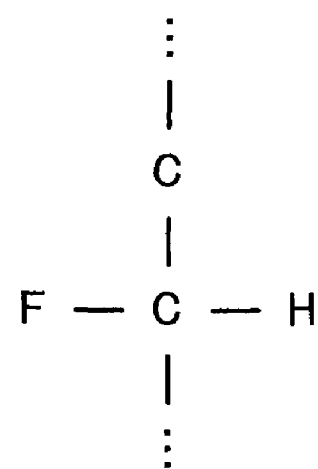

At this time, in the FFKM constituting the O-ring 12, first, when a fluorine radical deprives a carbon atom-to hydrogen atom bond in a cross-linked portion of a hydrogen atom (FIG. 6A), and a carbon atom having one dangling bond is produced in the cross-linked portion (FIG. 6B), there is a high possibility that the carbon atom bonds with another fluorine radical, not an oxygen radical (FIG. 7A). Here, in the case that another fluorine radical bonds with the carbon atom, no dangling bond remains in the carbon atom-to-fluorine atom bond. Therefore, the carbon atom-to-fluorine atom in the cross-linked portion becomes stable and never deprives a nearby bonded structure of a bond (FIG. 7B). Thus, the cross-link is not eliminated, and the elasticity of the O-ring 12 is never lost. As a result, the sealing function of the O-ring 12 can be maintained.

On the other hand, when the amount of CF type deposit attached to the component parts and so on when the wafer W is subjected to the first plasma etching is smaller than a specified value, the component parts and so on are heated in the plasma etching on one lot as described above so as to cause an excessive amount of oxygen radicals to exist in the reaction chamber 17 as compared with fluorine radicals in the dry cleaning.

At this time, in the FFKM constituting the O-ring 12, the possibility that a fluorine radical comes close to a carbon atom-to hydrogen atom bond in a cross-linked portion decreases, and hence the possibility that the fluorine radical deprives the carbon atom-to hydrogen atom bond of a hydrogen atom decreases. Thus, there is little possibility that a carbon atom having one dangling bond is produced in the cross-linked portion, and the bonded structure in the cross-linked portion does not collapse. Thus, the cross-link is not eliminated, and the elasticity of the O-ring 12 is never lost. As a result, the sealing function of the O-ring 12 can be maintained.

Although in the above described present embodiment, the abnormal wear of the O-ring 12 between the side wall 11a and the upper lid 11b of the chamber 11 is prevented, the present invention may be applied to not only the O-ring 12 but also a sealing member made of other fluorinated rubber existing at a location of the substrate processing apparatus 10, which can be reached by fluorine radicals and oxygen radicals.

Moreover, although in the above described present embodiment, the amount of CF type deposit attached to the component parts and so on is measured in the first plasma etching, the amount of fluorine radicals may be measured instead of the amount of deposit in the first plasma etching. Examples of a method of measuring the amount of fluorine radicals include a method in which a test piece of polyimide that wears due to fluorine radicals is disposed inside the manifold 18, the wear amount of the test piece is actually measured after the first plasma etching, and the amount of fluorine radicals in the reaction chamber 17 is estimated from the actually measured wear amount.

Further, in the above described present embodiment, it is necessary to grasp in advance the relationship between the amount of CF type deposit attached to the component parts and so on and the wear amount of the O-ring 12, and by grasping the relationship, the life of the O-ring 12 can be predicted from the amount of CF type deposit attached to the component parts and so on.

The substrates subjected to the plasma etching according to the above described embodiment are semiconductor wafers W, but the substrates subjected to the plasma etching are not limited to being semiconductor wafers W, but rather may instead be any of various glass substrates used in LCDs (Liquid Crystal Displays), FPDs (Flat Panel Displays) or the like.

Further, it is to be understood that the object of the present invention may also be accomplished by supplying a computer with a storage medium in which a program code of software, which realizes the functions of the above described embodiment is stored, and causing a CPU of the computer to read out and execute the program code stored in the storage medium.

In this case, the program code itself read from the storage medium realizes the functions of the above described embodiment, and hence the program code and the storage medium on which the program code is stored constitute the present invention.

Examples of the storage medium for supplying the program code include a medium capable of storing the above program code, for example, a RAM, an NV-RAM, a floppy (registered trademark) disk, a hard disk, a magnetic-optical disk, an optical disk such as a CD-ROM, a CD-R, a CD-RW, a DVD-ROM, a DVD-RAM, a DVD-RW, or a DVD+RW, a magnetic tape, a nonvolatile memory card, and a ROM. Alternatively, the program code may be supplied by downloading from another computer, a database, or the like, not shown, connected to the Internet, a commercial network, a local area network, or the like.

Further, it is to be understood that the functions of the above described embodiment may be accomplished not only by executing a program code read out by a computer, but also by causing an OS (an operating system) or the like which operates on a CPU to perform a part or all of the actual operations based on instructions of the program code.

Further, it is to be understood that the functions of the above described embodiment may be accomplished by writing a program code read out from the storage medium into a memory provided in an expansion board inserted into a computer or a memory provided in an expansion unit connected to the computer and then causing a CPU or the like provided in the expansion board or the expansion unit to perform a part or all of the actual operations based on instructions of the program code.

Further, the form of the program may be an object code, a program code executed by an interpreter, or a script data supplied to an OS.

What is claimed is:

1. A cleaning method for a substrate processing apparatus that has an accommodating chamber in which a substrate is accommodated, and a sealing member made of fluorine-based rubber that seals an interior of the accommodating chamber from outside, and that carries out plasma processing on the substrate using plasma produced from a fluorocarbon-based gas in the accommodating chamber, comprising:
   a first plasma processing step of carrying out the plasma processing on at least one substrate;
   a measuring step of measuring an amount of deposit produced in the accommodating chamber in said first plasma processing step;
   a determination step of determining whether the measured amount of the deposit is larger than a predetermined amount;
   a second plasma processing step of carrying out the plasma processing subsequent to said determination step;
   a cleaning step of supplying a cleaning gas containing at least oxygen gas to the interior of the accommodating chamber and applying radio-frequency voltage to the interior of the accommodating chamber to produce oxygen radicals from the cleaning gas,
   wherein when in said determination step the amount of the deposit is determined to be larger than the predetermined amount, the amount of the deposit in the accommodating chamber is increased in said second plasma processing step, and when in said determination step the amount of the deposit in the accommodating chamber is determined to be smaller than the predetermined amount, the amount of the deposit is decreased in said second plasma processing step.

2. A cleaning method as claimed in claim 1, wherein when the amount of the deposit is smaller than the predetermined amount, component parts of the accommodating chamber are heated in said second plasma processing step.

3. A cleaning method as claimed in claim 1, wherein when the amount of the deposit is smaller than the predetermined amount, a value of the radio-frequency voltage applied to the interior of the accommodating chamber in said cleaning step is increased.

4. A cleaning method as claimed in claim 1, wherein when the amount of the deposit is smaller than the predetermined amount, an amount of the oxygen gas contained in the cleaning gas is increased.

5. A cleaning method as claimed in claim 1, wherein when the amount of the deposit is smaller than the predetermined amount, a hydrogen-containing gas is mixed in the cleaning gas.

6. A cleaning method as claimed in claim 1, wherein when the amount of the deposit is larger than the predetermined amount, component parts of the accommodating chamber are cooled in said second plasma processing step.

7. A cleaning method as claimed in claim 1, wherein when the amount of the deposit is larger than the predetermined amount, an amount of the oxygen gas contained in the cleaning gas is decreased.

8. A cleaning method as claimed in claim 1, wherein when the amount of the deposit is larger than the predetermined amount, a fluorocarbon-based gas is mixed in the cleaning gas.

9. A cleaning method as claimed in claim 1, wherein when the amount of the deposit is larger than the predetermined amount, a flow rate of the fluorocarbon-based gas in the plasma processing is increased.

10. A cleaning method as claimed in claim 1, wherein in said first plasma processing step, the plasma processing is carried out on one or a predetermined number of substrates, and in said second plasma processing step, the plasma processing is carried out on substrates of one lot.

11. A cleaning method as claimed in claim 5, wherein the hydrogen-containing gas comprises methane gas.

* * * * *